(12) United States Patent
Furukawa et al.

(10) Patent No.: US 7,268,028 B1
(45) Date of Patent: Sep. 11, 2007

(54) WELL ISOLATION TRENCHES (WIT) FOR CMOS DEVICES

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,962

(22) Filed: Apr. 17, 2006

(51) Int. Cl.
*H01L 21/336* (2006.01)
*H01L 21/8234* (2006.01)
*H01L 21/8238* (2006.01)
*H01L 21/8249* (2006.01)
*H01L 21/8244* (2006.01)
*H01L 21/8242* (2006.01)

(52) U.S. Cl. .............. 438/197; 438/199; 438/231; 438/238; 438/243; 438/386; 438/387; 438/391; 257/E21.546; 257/E21.548; 257/E21.628

(58) Field of Classification Search .............. 438/197, 438/199, 231, 238, 243, 386, 387, 391
See application file for complete search history.

(56) References Cited

U.S. PATENT DOCUMENTS

| | | | |
|---|---|---|---|
| 5,536,675 A | 7/1996 | Bohr | |
| 5,814,547 A * | 9/1998 | Chang | ........................ 438/329 |
| 6,137,152 A | 10/2000 | Wu | |
| 6,297,127 B1 | 10/2001 | Chen et al. | |
| 6,306,720 B1 * | 10/2001 | Ding | ........................ 438/391 |
| 6,320,233 B1 | 11/2001 | Yamaguchi et al. | |
| 6,509,615 B2 | 1/2003 | Iwata et al. | |
| 6,849,492 B2 * | 2/2005 | Helm et al. | ................. 438/217 |
| 6,875,697 B2 | 4/2005 | Trivedi | |
| 6,956,266 B1 | 10/2005 | Voldman et al. | |
| 7,189,607 B2 * | 3/2007 | Helm et al. | ................. 438/217 |
| 2002/0158309 A1 | 10/2002 | Swanson et al. | |
| 2003/0213995 A1 | 11/2003 | Duvvury et al. | |
| 2004/0108566 A1 | 6/2004 | Himi et al. | |
| 2004/0227196 A1 * | 11/2004 | Yoneda | ....................... 257/410 |
| 2005/0064678 A1 | 3/2005 | Dudek et al. | |
| 2005/0093077 A1 * | 5/2005 | Ieong et al. | ................ 257/369 |
| 2005/0106800 A1 | 5/2005 | Haensch et al. | |
| 2006/0003513 A1 * | 1/2006 | Helm et al. | ................. 438/199 |
| 2007/0040235 A1 * | 2/2007 | Chan et al. | ................. 257/510 |

* cited by examiner

*Primary Examiner*—Michael Lebentritt
*Assistant Examiner*—Mohsen Ahmadi
(74) *Attorney, Agent, or Firm*—Schmeiser, Olsen & Watts; William D. Sabo

(57) ABSTRACT

A well isolation trenches for a CMOS device and the method for forming the same. The CMOS device includes (a) a semiconductor substrate, (b) a P well and an N well in the semiconductor substrate, (c) a well isolation region sandwiched between and in direct physical contact with the P well and the N well. The P well comprises a first shallow trench isolation (STI) region, and the N well comprises a second STI region. A bottom surface of the well isolation region is at a lower level than bottom surfaces of the first and second STI regions. When going from top to bottom of the well isolation region, an area of a horizontal cross section of the well isolation region is an essentially continuous function.

13 Claims, 12 Drawing Sheets

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

WELL ISOLATION TRENCHES (WIT) FOR CMOS DEVICES

BACKGROUND OF THE INVENTION

1. Technical Field

The present invention relates to well isolation trenches (WIT), and more particularly, to well isolation trenches for CMOS (Complementary Metal Oxide Semiconductor) devices (for example SRAM-Static Random Access Memory).

2. Related Art

In a conventional CMOS device including an N channel and a P channel transistor, the N channel transistor is formed on a P well, and the P channel is formed on an N well. There is always a need for a well isolation trench structure (and a method for forming the same) that provides improved electrical properties of the CMOS device.

SUMMARY OF THE INVENTION

The present invention provides a semiconductor fabrication method, comprising providing a semiconductor structure which includes: (a) a semiconductor substrate, and (b) a patterned hard mask layer on top of the semiconductor substrate; etching the semiconductor substrate using the patterned hard mask layer as a mask, resulting in a well isolation trench, a first shallow trench, and a second shallow trench; after said etching the semiconductor substrate is performed, covering the first and second shallow trenches without covering the well isolation trench; and after said covering the first and second shallow trenches is performed, etching the semiconductor substrate through the well isolation trench, resulting in the well isolation trench becoming deeper such that when going from top to bottom of the well isolation region, an area of a horizontal cross section of the well isolation region is an essentially continuous function.

The present invention provides a semiconductor structure, comprising (a) a semiconductor substrate; (b) a P well and an N well in the semiconductor substrate, wherein the P well comprises a first shallow trench isolation (STI) region, and wherein the N well comprises a second STI region; and (c) a well isolation region sandwiched between and in direct physical contact with the P well and the N well, wherein a bottom surface of the well isolation region is at a lower level than bottom surfaces of the first and second STI regions, and wherein when going from top to bottom of the well isolation region, an area of a horizontal cross section of the well isolation region is an essentially continuous function.

The present invention provides a well isolation trench (and a method for forming the same) that provides improved electrical properties of the CMOS device.

BRIEF DESCRIPTION OF THE DRAWINGS

FIGS. 1A-12A show top views of a semiconductor structure 100 going through a fabrication process, in accordance with embodiments of the present invention.

FIGS. 1B-12B show cross section views of the semiconductor structure 100 of FIGS. 1A-12A, respectively, in accordance with embodiments of the present invention.

DETAILED DESCRIPTION OF THE INVENTION

FIGS. 1A-12A show top views of a semiconductor structure 100 going through a fabrication process, in accordance with embodiments of the present invention. FIGS. 1B-12B show cross section views of the semiconductor structure 100 of FIGS. 1A-12A, respectively, in accordance with embodiments of the present invention.

Figure 1A:
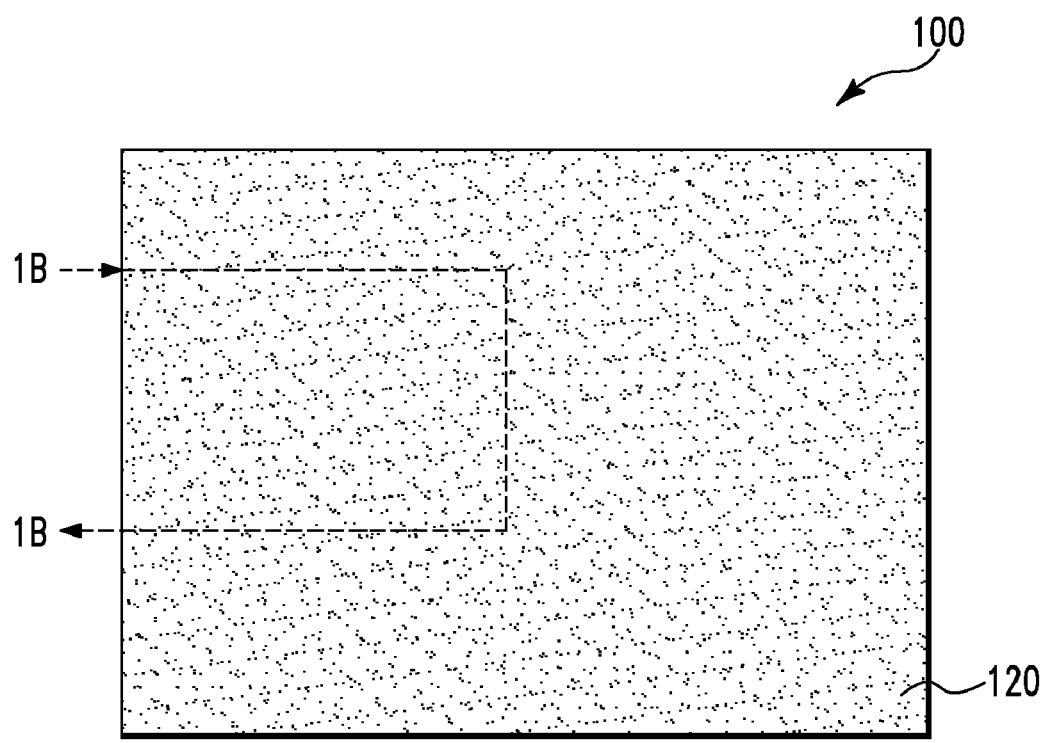
Figure 1B:
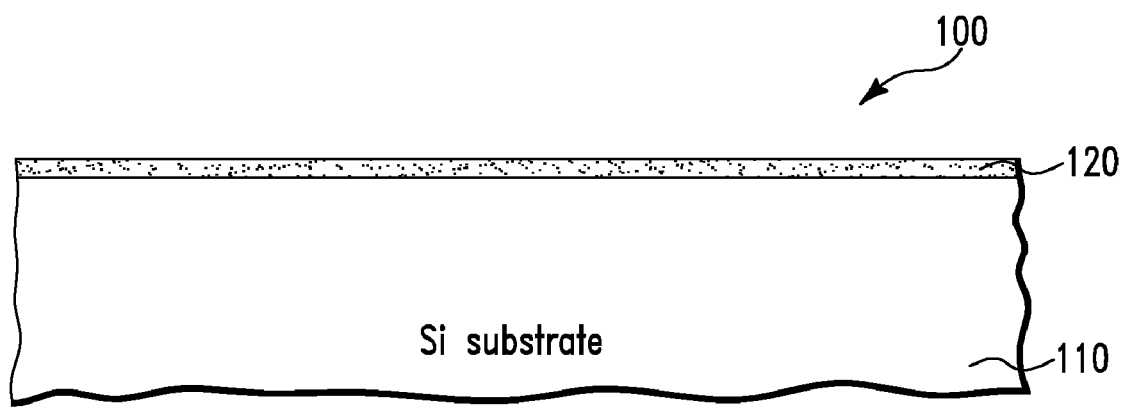

More specifically, with reference to FIG. 1A and FIG. 1B (a cross section view of FIG. 1A along a line 1B-1B), in one embodiment, the fabrication process starts out with a semiconductor substrate 110 (such as silicon substrate). Next, in one embodiment, a pad oxide layer 120 is formed on top of the semiconductor substrate 110 by, illustratively, thermal oxidation. Alternatively, the pad oxide layer 120 can be formed by using a deposition technique such as CVD (Chemical Vapor Deposition) method.

Figure 2A:
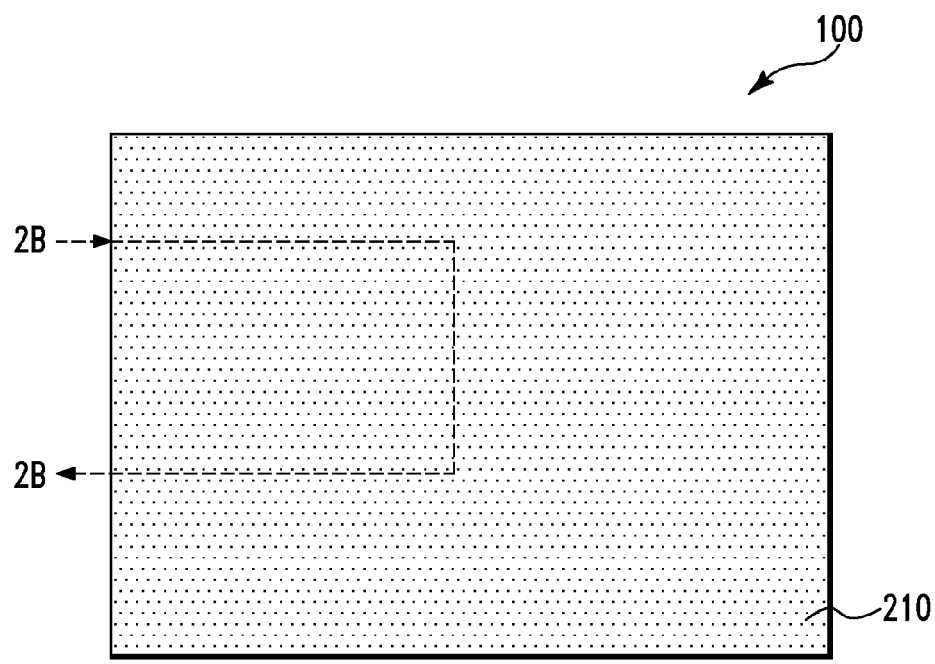
Figure 2B:
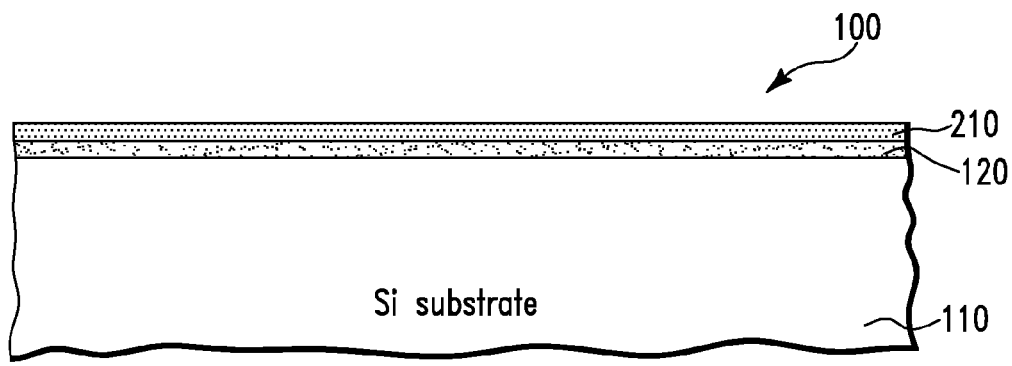

Next, with reference to FIG. 2A and FIG. 2B (a cross section view of FIG. 2A along a line 2B-2B), in one embodiment, a pad nitride layer 210 is formed on top of the structure 100 of FIG. 1A using CVD method. Illustratively, the pad nitride layer 210 comprises silicon nitride.

Figure 3A:
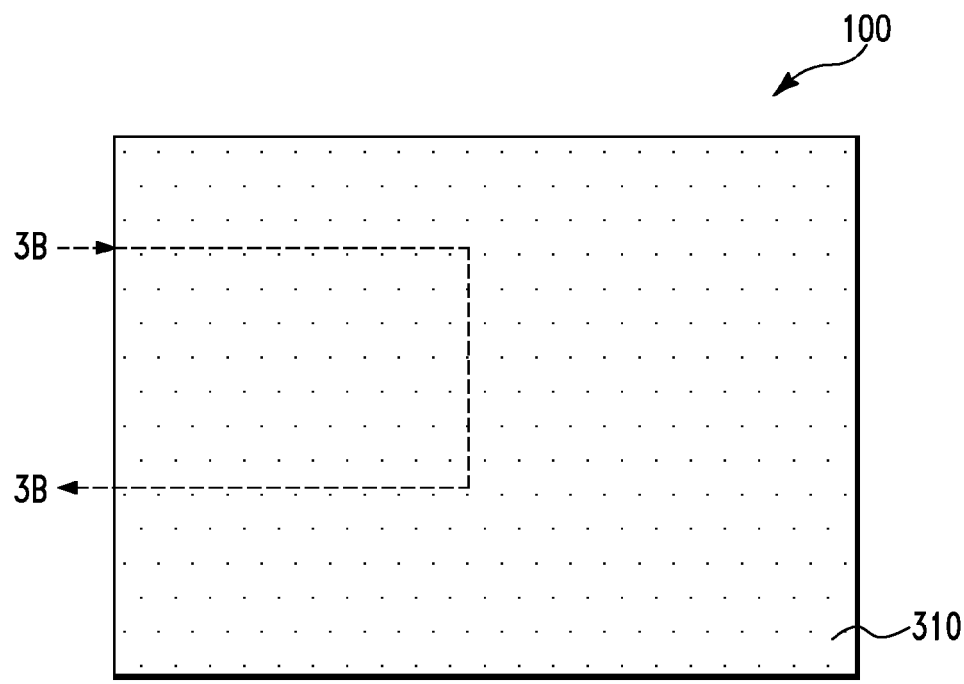
Figure 3B:
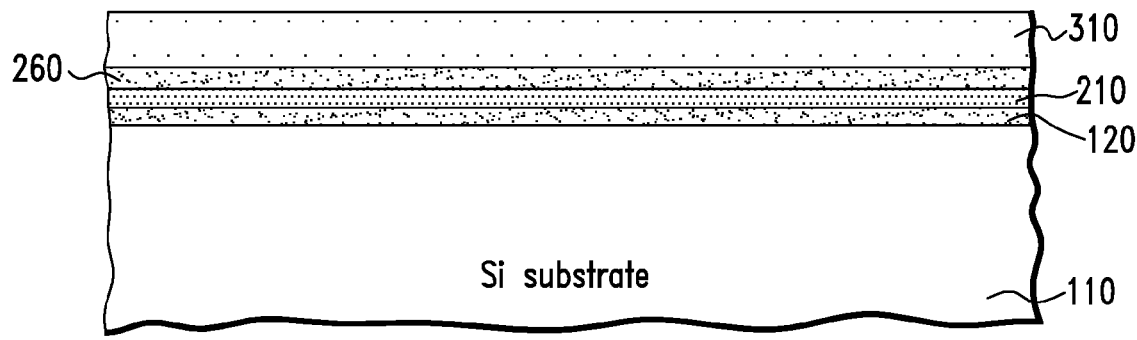

Next, with reference to FIG. 3A and FIG. 3B (a cross section view of FIG. 3A along a line 3B-3B), in one embodiment, a hard mask layer 260 is deposited on top of the structure 100 of FIG. 2A using CVD method. Illustratively, the hard mask layer 260 comprises silicon dioxide or any other suitable material.

Next, in one embodiment, a first photo resist layer 310 is formed on top of the hard mask layer 260 using a conventional method.

Figure 4A:
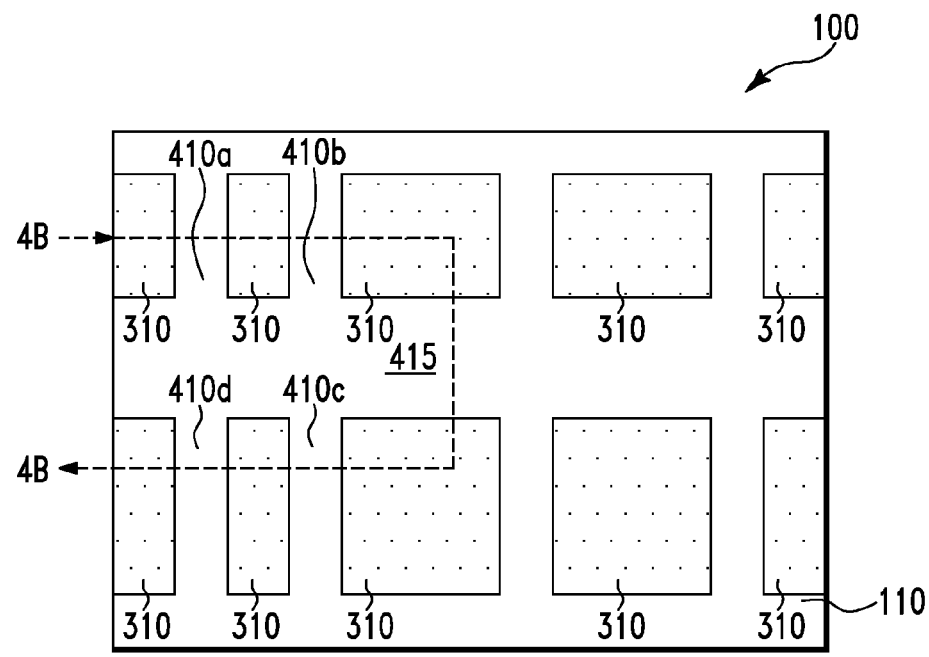
Figure 4B:
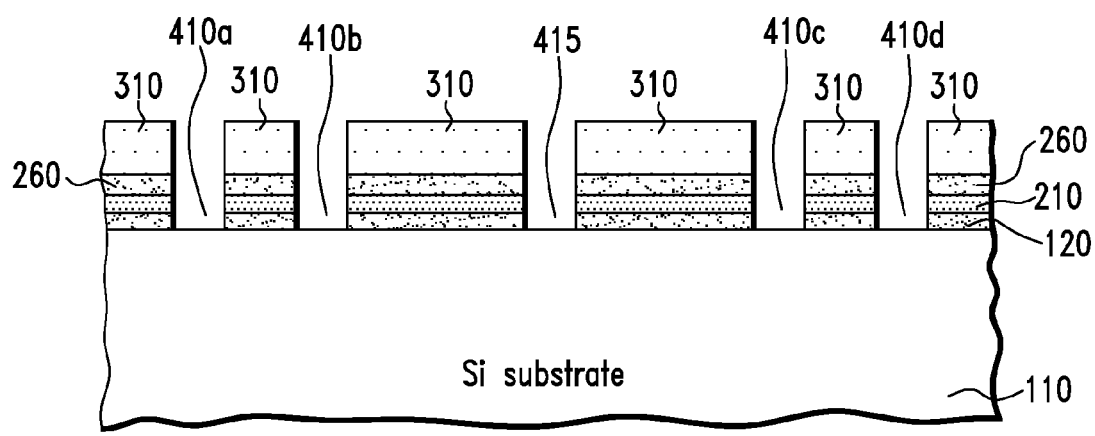

Next, in one embodiment, the first photo resist layer 310 is patterned using a conventional lithography process resulting in a first patterned photo resist layer 310 as shown in FIG. 4A and FIG. 4B (a cross section view of FIG. 4A along a line 4B-4B).

Next, in one embodiment, the pattern of the first patterned photo resist layer 310 is transferred in turn to the hard mask layer 260, the pad nitride layer 210, and the pad oxide layer 120, resulting in the structure 100 of FIG. 4A and FIG. 4B. Illustratively, the patterning process is performed by a conventional etching process, resulting in openings 410a, 410b, 415, 410c, and 410d in the layers 120, 210, and 260, 310.

Figure 5A:
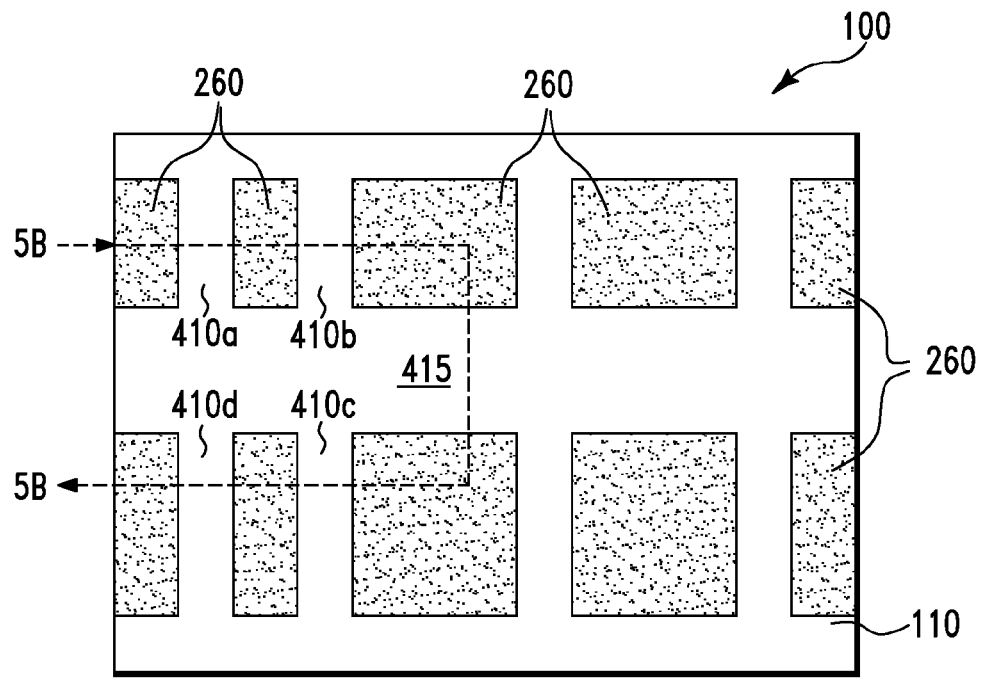
Figure 5B:
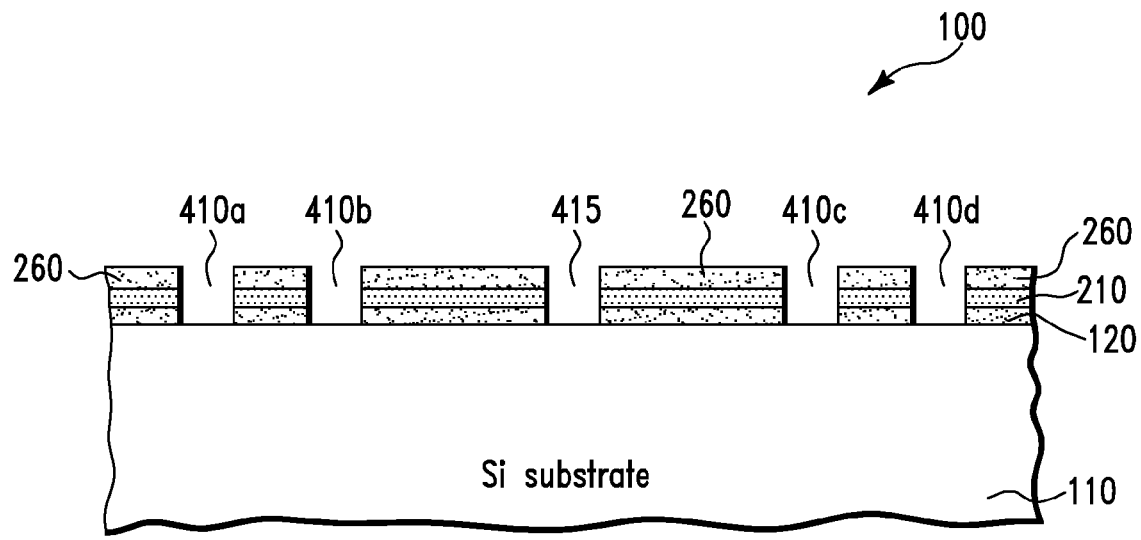

Next, in one embodiment, the first photo resist layer 310 is removed, resulting in the structure 100 of FIG. 5A and FIG. 5B (a cross section view of FIG. 5A along a line 5B-5B). Illustratively, the first photo resist layer 310 is removed using a conventional method.

Next, in one embodiment, the semiconductor substrate 110 is etched via the openings 410a, 410b, 415, 410c, and 410d. Illustratively, the semiconductor substrate 110 is etched by RIE (Reactive Ion Etching) process, resulting in shallow trenches 410a', 410b', 415', 410c', and 410d', respectively, as shown in FIG. 6A and FIG. 6B (a cross section view of FIG. 6A along a line 6B-6B).

Figure 6A:
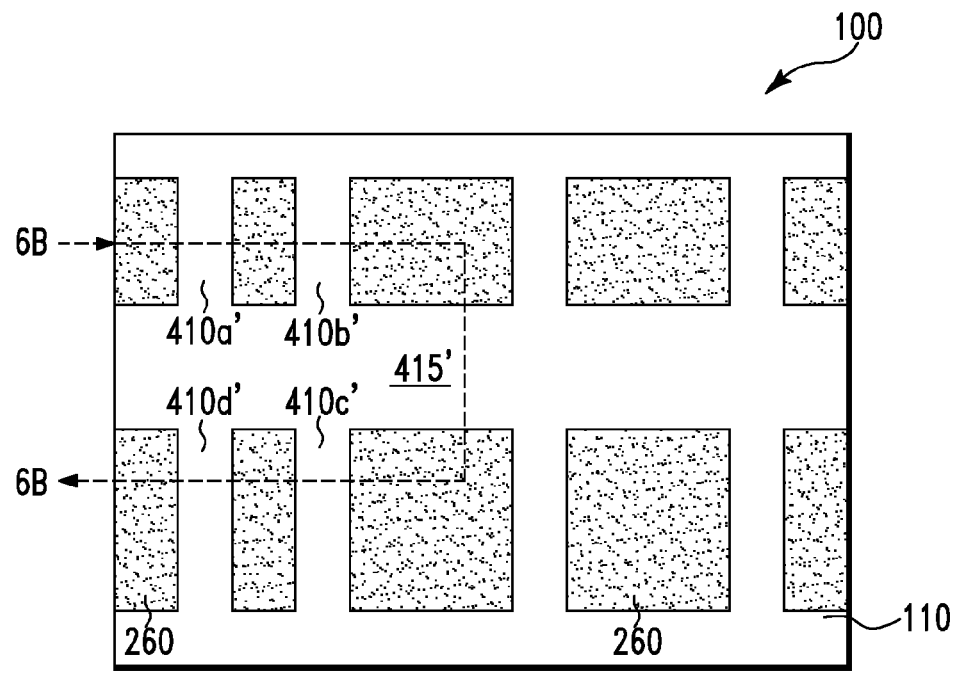
Figure 6B:
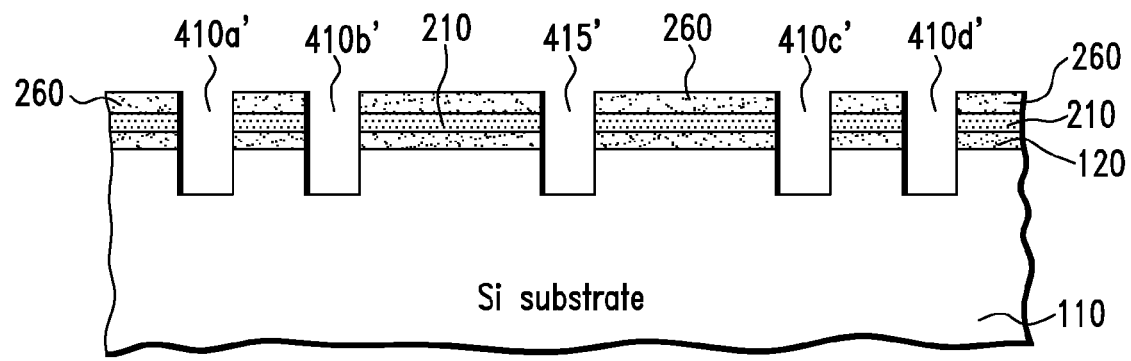
Figure 7A:
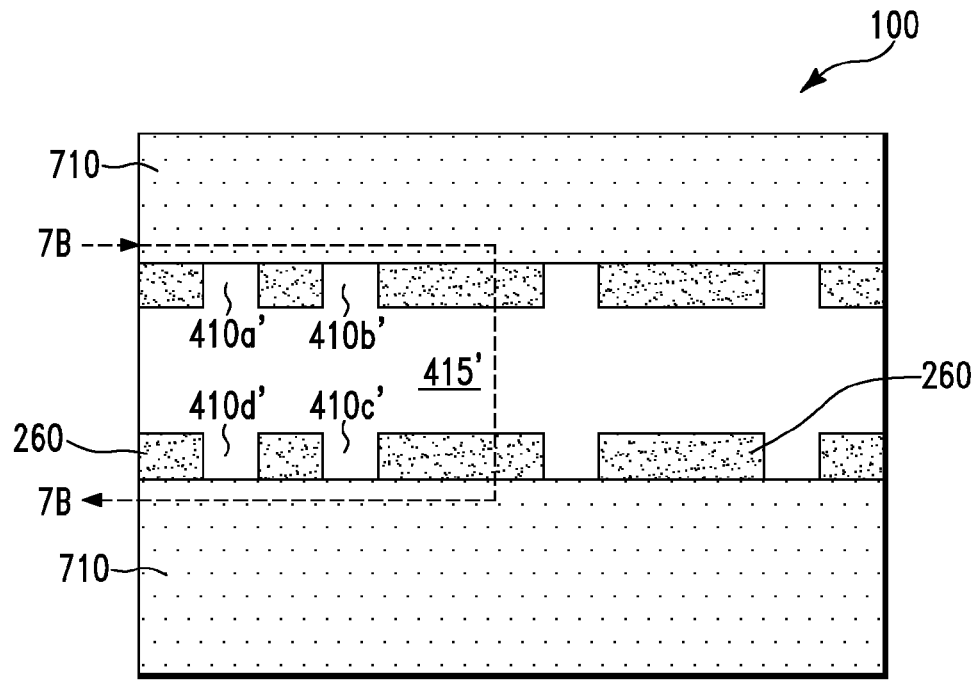
Figure 7B:
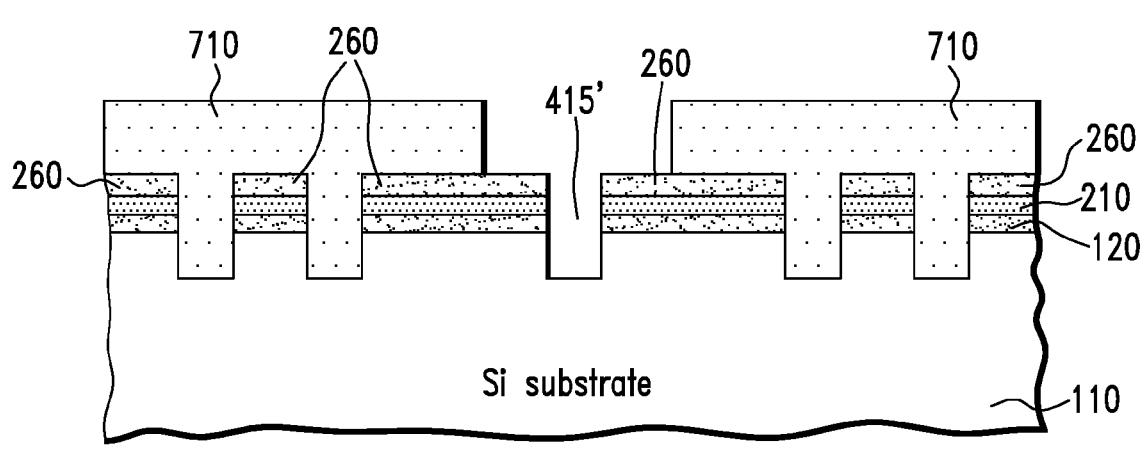

Next, with reference to FIG. 7A and FIG. 7B (a cross section view of FIG. 7A along a line 7B-7B), in one embodiment, a second patterned photo resist layer 710 is formed on top of the structure 100 of FIG. 6A. More specifically, the second patterned photo resist layer 710 is formed by using a conventional lithography process. It should be noted that portions of the trenches 410a', 410b', 410c', and 410d' and the entire trench 415' are not covered by the second patterned photo resist layer 710, as shown in FIG. 7A and FIG. 7B.

Figure 8A:
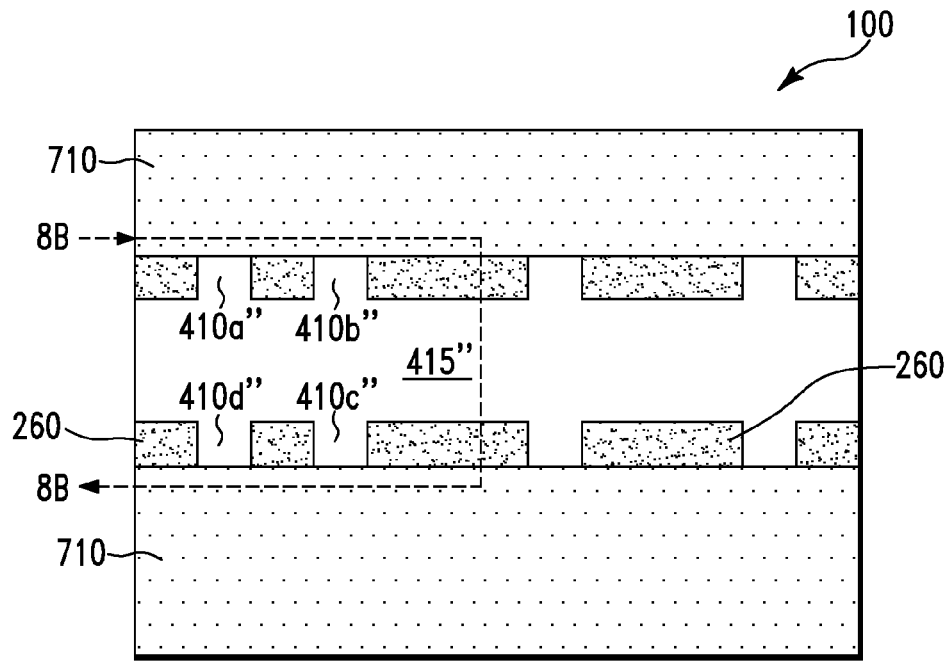
Figure 8B:
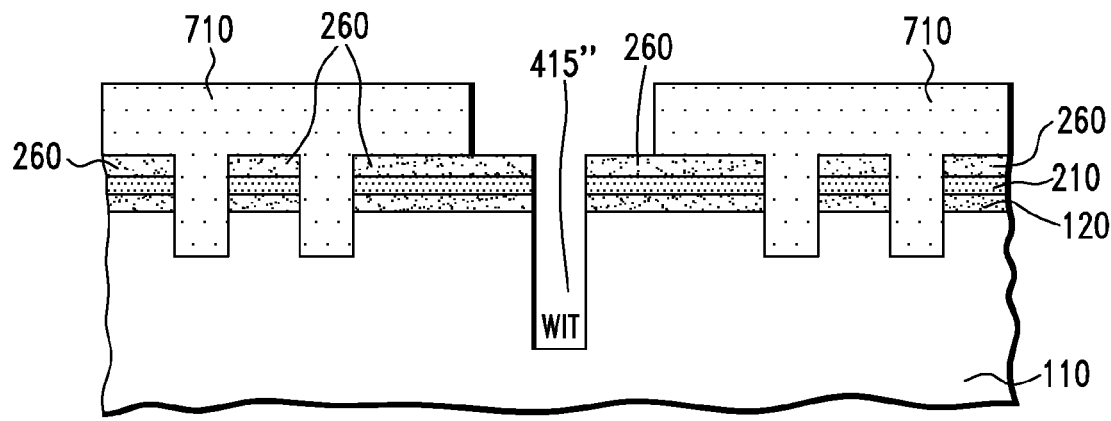

Next, with reference to FIG. 8A and FIG. 8B (a cross section view of FIG. 8A along a line 8B-8B), in one embodiment, the second patterned photo resist layer 710 and the hard mask layer 260 are used as masks for directionally etching the semiconductor substrate 110, resulting in structure 100 of FIG. 8A and FIG. 8B. In other words, sections of the trenches 410a', 410b', 410c', 410d', and 415' of FIG. 7A and FIG. 7B, which are not covered by the masks, become deeper, resulting in the trenches 410a'', 410b'', 410c'', 410d'', and a well isolation trench 415'', respectively, as shown in FIG. 8A and FIG. 8B.

It should be noted that the process of forming the trench 415' (FIG. 7A, FIG. 7B) and the process of making the trench 415' deeper, resulting in the well isolation trench 415'', uses the same hard mask 260. As a result, when going from top to bottom of the well isolation trench 415'', an area of a horizontal cross section of the well isolation trench 415'' does not change abruptly. In other words, when going from top to bottom of the well isolation trench 415'', an area of a horizontal cross section of the well isolation trench 415'' is essentially a continuous function (i.e., either varies essentially continuously or remains essentially unchanged). The position and the width of the well isolation trench 415'' are identical to the initial shallow trench 415'.

Figure 9A:
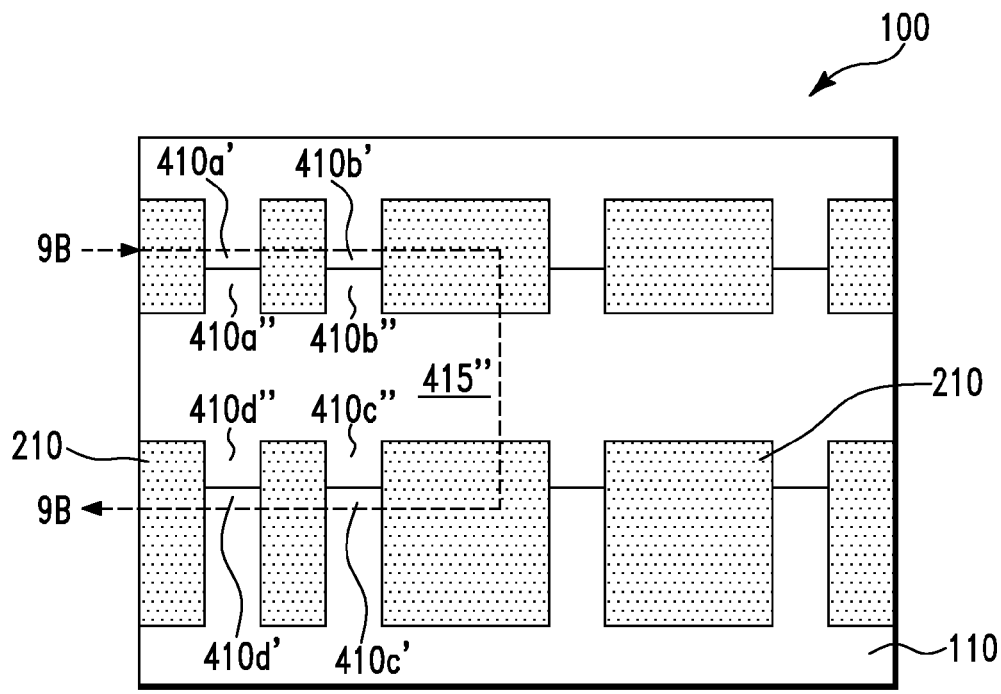
Figure 9B:
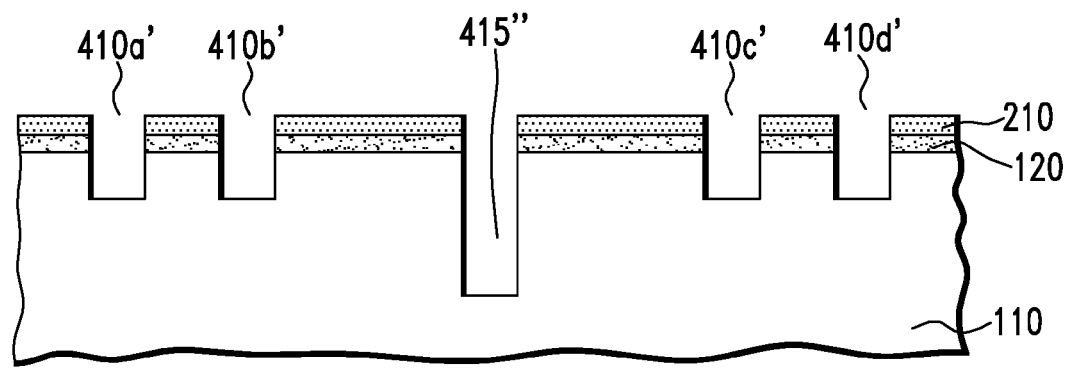

Next, with reference to FIG. 9A and FIG. 9B (a cross section view of FIG. 9A along a line 9B-9B), in one embodiment, the second patterned photo resist layer 710 (FIG. 8A and FIG. 8B) is removed by a conventional method, and then the hard mask layer 260 (FIG. 8A and FIG. 8B) is removed using wet etching.

Figure 10A:
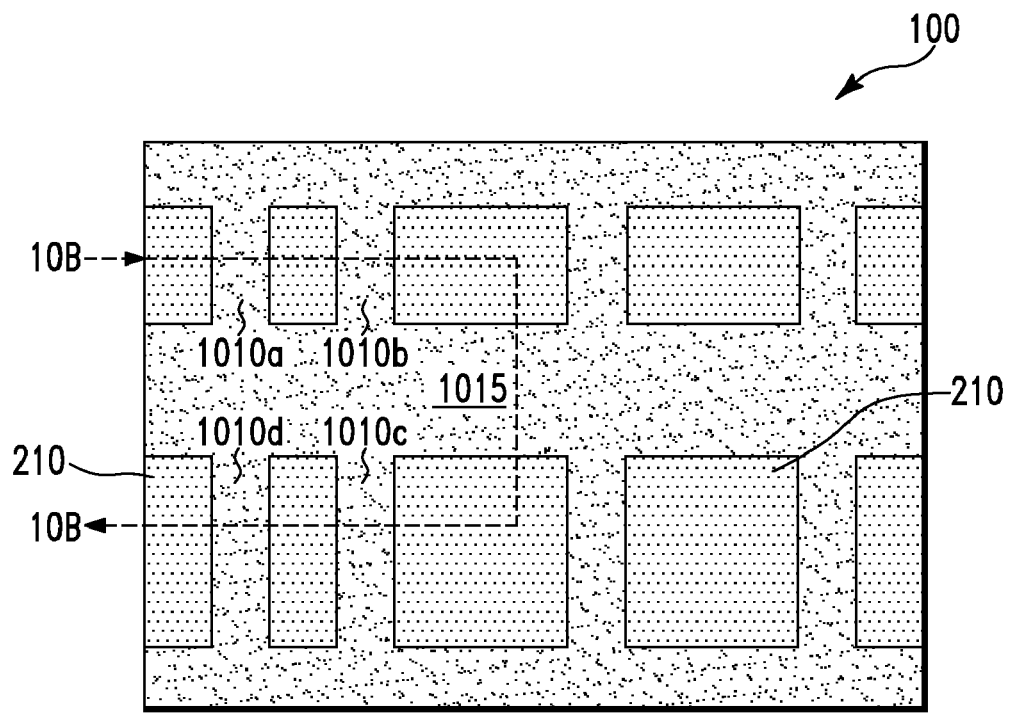
Figure 10B:
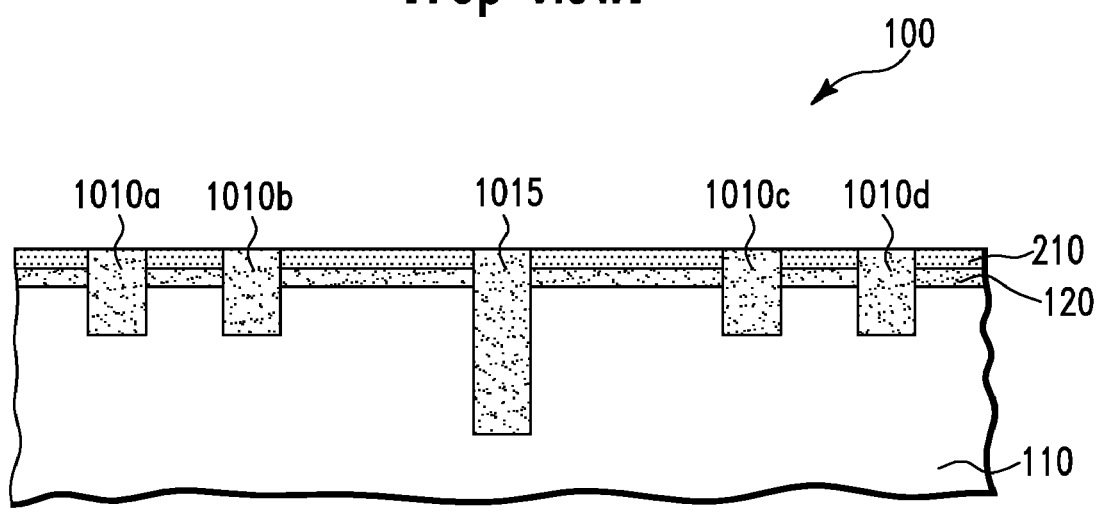
Figure 11A:
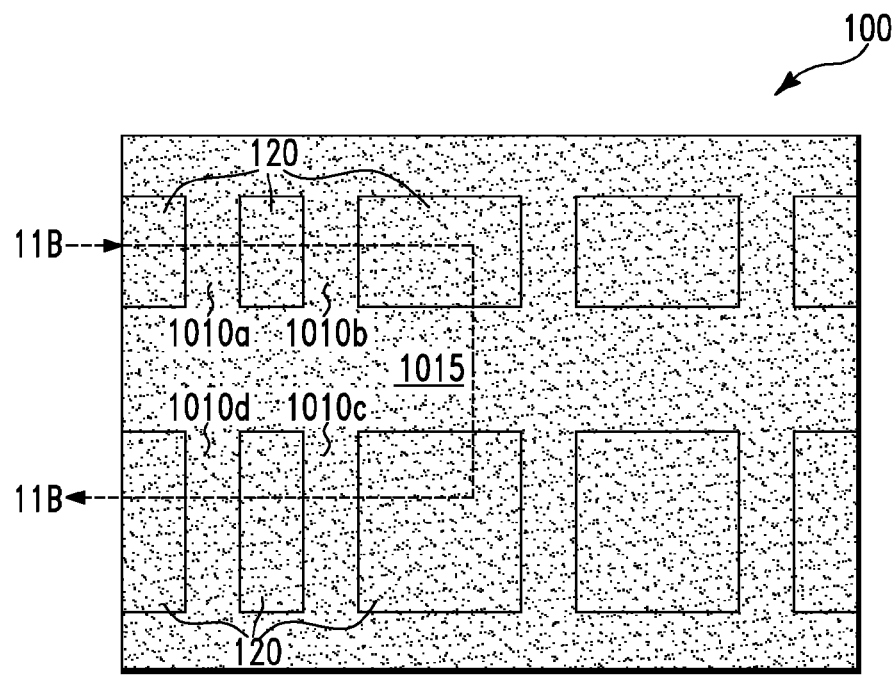
Figure 11B:
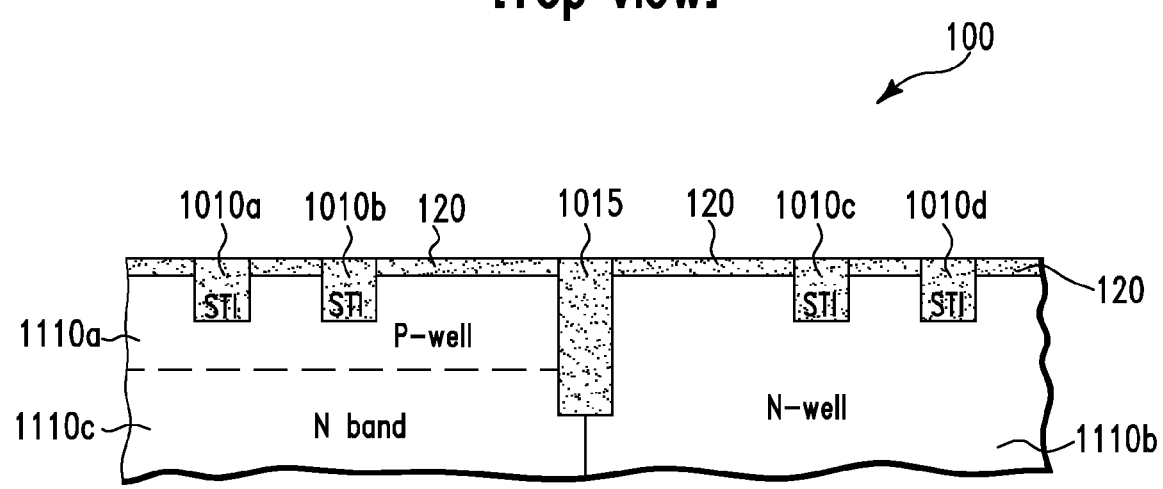

Next, with reference to FIG. 10A and FIG. 10B (a cross section view of FIG. 10A along a line 10B-10B), in one embodiment, STI (Shallow Trench Isolation) regions 1010a, 1010b, 1010c, and 1010d are formed in the trenches 410a' and 410a'', 410b' and 410b'', 410c' and 410c'', and 410d' and 410d'', respectively, and a well isolation region 1015 is formed in the well isolation trench 415''. Illustratively, the STI regions 1010a, 1010b, 1010c, 1010d and the well isolation region 1015 comprise silicon dioxide. In one embodiment, the STI regions 1010a, 1010b, 1010c, 1010d and the well isolation region 1015 are formed by (i) CVD of a silicon dioxide layer (not shown) everywhere on top of the structure 100 (including in the trenches) of FIG. 10 and then (ii) CMP (Chemical Mechanical Polishing) the deposited silicon dioxide layer until the pad nitride layer 210 is exposed to the surrounding ambient, resulting in the STI regions 1010a, 1010b, 1010c, 1010d and the well isolation region 1015, as shown in FIG. 10A and FIG. 10B. As a result, when going from top to bottom of the well isolation region 1015, an area of a horizontal cross section of the well isolation region 1015 does not change abruptly.

Next, in one embodiment, the STI regions 1010a, 1010b, 1010c, 1010d and the well isolation region 1015 are recessed to approximately the top surface of the pad oxide 120. Next, in one embodiment, the pad nitride layer 210 is removed by wet etching followed by a CMP process resulting in the structure 100 of FIG. 11A and FIG. 11B (a cross section view of FIG. 11A along a line 11B-11B). Next, with reference to FIG. 11A and FIG. 11B, in one embodiment, a P-region 1110a and an N-region 1110b are formed in the semiconductor substrate 110 to the north and south of the trench 1015, respectively. Illustratively, the P-region 1110a is formed by ion implantation with P-type dopants, and the N-region 1110b is formed by ion implantation with N type dopants, resulting in structure 100 of FIG. 11A and FIG. 11B. Hereafter, the P-region 1110a is referred to as a P-well region 1110a and the N-region 1110b is referred to as an N-well region 1110b. In one embodiment, an N-band 1110c is also formed by ion implantation under the P-well. The N-band is connected to the N-well.

Figure 12A:
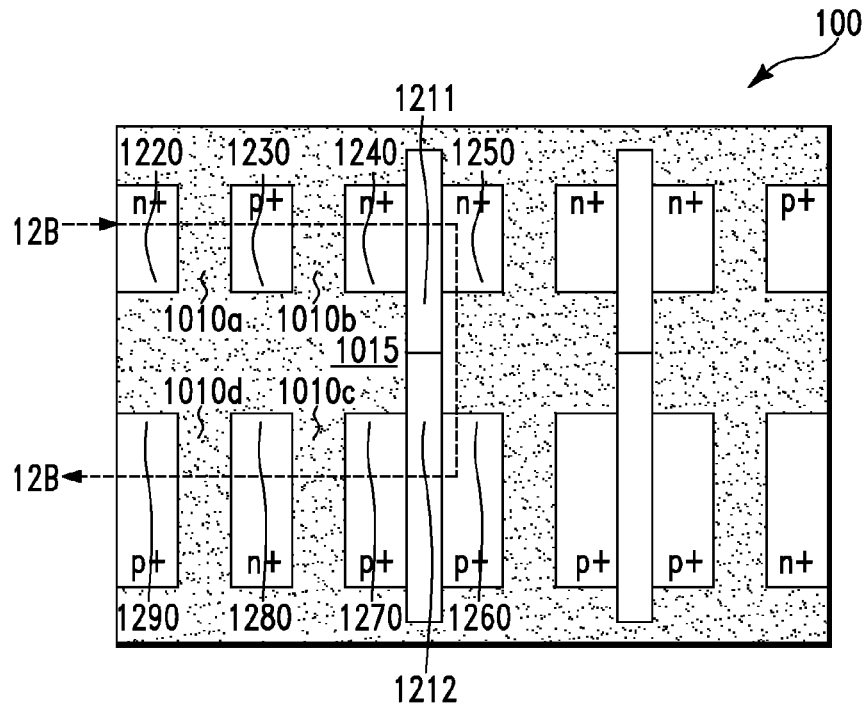
Figure 12B:
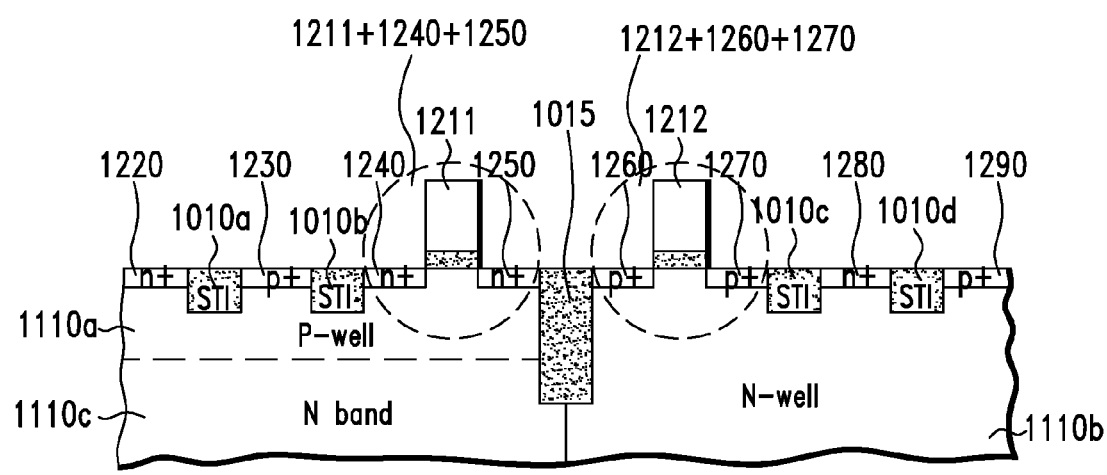

Next, with reference to FIG. 12A and FIG. 12B (a cross section view of FIG. 12A along a line 12B-12B), in one embodiment, doped regions 1220, 1230, 1240, 1250, 1260, 1270, 1280, and 1290 and gate stacks 1211 and 1212 are formed in the semiconductor substrate 1100. In one embodiment, the gate stacks 1211 and 1212 are formed by a conventional method. In one embodiment, the doped regions 1220, 1230, 1240, 1250, 1260, 1270, 1280, and 1290 are formed by ion implantation. Illustratively, the doped regions 1220, 1240, 1250, and 1280 are doped with N type dopants, and the doped regions 1230, 1260, 1270, and 1290 are doped with P type dopants. In one embodiment, the gate stack 1211 and the doped regions 1240 and 1250 form an N-channel transistor 1211+1240+1250; whereas the gate stack 1212 and the doped regions 1260 and 1270 form a P-channel transistor 1212+1260+1270. In one embodiment, the N-channel transistor 1211+1240+1250 and the P-channel transistor 1212+1260+1270 are connected so as to form a CMOS device. The doped regions 1280 and 1230 and for the N-well and the P-well contacts, respectively.

As can be seen in FIG. 12A and FIG. 12B, the N-channel transistor 1211+1240+1250 is formed on top of the P-well region 1110a, and the P-channel transistor 1212+1260+1270 is formed on top of the N-well region 1110b. These two transistors are separated by the well isolation region 1015 (which is formed in the well isolation trench 415'' of FIG. 9A and FIG. 9B) wherein the well isolation region 1015 is deeper than the STI regions 1010a, 1010b, 1010c, 1010d. Therefore, the CMOS device has better device properties.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
providing a semiconductor structure which includes:
(a) a semiconductor substrate, and
(b) a patterned hard mask layer on top of the semiconductor substrate;
etching the semiconductor substrate using the patterned hard mask layer as a mask, resulting in a well isolation trench, a first shallow trench, and a second shallow trench;
after said etching the semiconductor substrate is performed, covering the first and second shallow trenches without covering the well isolation trench;
after said covering the first and second shallow trenches is performed, etching the semiconductor substrate through the well isolation trench, resulting in the well isolation trench becoming deeper such that when going from top to bottom of the well isolation region, an area of a horizontal cross section of the well isolation region is an essentially continuous function after said etching the semiconductor substrate through the well isolation trench is performed, uncovering the first and second shallow trenches so as to expose the first and second shallow trenches to a surrounding ambient; and then
filling the first and second shallow trenches and the well isolation trench with a dielectric material so as to form a first shallow trench isolation (STI) region, a second STI region and a well isolation region in the first and second shallow trenches and the well isolation trench, respectively.

2. The method of claim 1, wherein the patterned hard mask layer comprises:

a pad oxide layer on top of the semiconductor substrate, a pad nitride layer on top of the pad oxide layer, and a silicon dioxide layer on top of the pad nitride layer.

3. The method of claim 1, wherein the said etching the semiconductor substrate using the patterned hard mask layer as a mask is performed anisotropically.

4. The method of claim 1, wherein the said covering the first and second shallow trenches without covering the well isolation trench comprises forming a patterned photo resist layer on top of the patterned hard mask layer such that the first and second shallow trenches are completely filled by the patterned photo resist layer.

5. The method of claim 1, wherein the said etching the semiconductor substrate through the isolation trench is performed anisotropically.

6. The method of claim 1, further comprising removing a silicon dioxide layer of the patterned hard mask layer, after said etching is performed, wherein the patterned hard mask layer comprises:

a pad oxide layer on top of the semiconductor substrate, a pad nitride layer on top of the pad oxide layer, and a silicon dioxide layer on top of the pad nitride layer.

7. The method of claim 6, further comprising removing the pad nitride layer after said filling is performed.

8. The method of claim 7, further comprising, after said filling is performed, forming a P well and an N well in the semiconductor substrate such that the well isolation region sandwiched between and in direct physical contact with the P well and N well.

9. The method of claim 8, further comprising forming (i) an N channel transistor on the P well and (ii) a P channel transistor on the N well.

10. The method of claim 9, wherein the N channel transistor and the P channel transistor are connected so as to form a CMOS device.

11. The method of claim 8, wherein the P well and the N well are formed by ion implantation.

12. The method of claim 8, further comprising forming an N band directly beneath the P well and in direct physical contact with the N well.

13. The method of claim 1, wherein said etching the semiconductor substrate through the well isolation trench is performed using the patterned hard mask layer as an etching mask.

* * * * *